(12) United States Patent
Luo et al.

(10) Patent No.: US 11,996,417 B2
(45) Date of Patent: May 28, 2024

(54) DISPLAY PANEL AND ELECTRONIC DEVICE HAVING SAME

(71) Applicant: Shenzhen China Star Optoelectronics Semiconductor Display Technology Co., Ltd., Guangdong (CN)

(72) Inventors: Lisha Luo, Guangdong (CN); Ilgon Kim, Guangdong (CN); Bin Zhao, Guangdong (CN); Xin Zhang, Guangdong (CN); Jun Zhao, Guangdong (CN)

(73) Assignee: Shenzhen China Star Optoelectronics Semiconductor Display Technology Co., Ltd., Guangdong (CN)

( * ) Notice: Subject to any disclaimer, the term of this patent is extended or adjusted under 35 U.S.C. 154(b) by 896 days.

(21) Appl. No.: 16/962,514

(22) PCT Filed: Apr. 22, 2020

(86) PCT No.: PCT/CN2020/086031
§ 371 (c)(1),
(2) Date: Jul. 16, 2020

(87) PCT Pub. No.: WO2021/189577
PCT Pub. Date: Sep. 30, 2021

(65) Prior Publication Data
US 2023/0116544 A1    Apr. 13, 2023

(30) Foreign Application Priority Data

Mar. 22, 2020 (CN) .............................. 202010204810

(51) Int. Cl.
*H10K 59/131* (2023.01)
*G02F 1/1362* (2006.01)
(Continued)

(52) U.S. Cl.
CPC .... *H01L 27/1244* (2013.01); *G02F 1/136254* (2021.01); *G02F 1/136286* (2013.01); *H10K 59/131* (2023.02); *H10K 71/70* (2023.02)

(58) Field of Classification Search
CPC .......................... H01L 27/1244; H10K 59/131
See application file for complete search history.

(56) References Cited

U.S. PATENT DOCUMENTS

2010/0321624 A1   12/2010   Yanagisawa
2018/0108681 A1   4/2018    Ye et al.

FOREIGN PATENT DOCUMENTS

| CN | 1832181 | 9/2006 |
| CN | 104656327 | 5/2015 |

(Continued)

*Primary Examiner* — Michele Fan
(74) *Attorney, Agent, or Firm* — PV IP PC; Wei Te Chung; Zhigang Ma (57) ABSTRACT

Embodiments of the present disclosure provide a display panel comprising a plurality of first connecting lines and a plurality of second connecting lines which are cross-arranged, a first insulation layer, a second insulation layer defining first holes extending through the first insulation layer and the second insulation layer and second holes extending through the second insulation layer, and a plurality of third connecting lines, wherein each of the plurality of the third connecting lines is electrically connected to a corresponding one of the plurality of the first connecting lines via a corresponding one of the first hole and is electrically connected to a corresponding one of the plurality of the second connecting lines via a corresponding one of the second hole, and each of the second holes does not overlap the plurality of the first connecting lines in a top view.

20 Claims, 3 Drawing Sheets

(51) Int. Cl.
*H01L 27/12* (2006.01)
*H10K 71/70* (2023.01)

(56) References Cited

FOREIGN PATENT DOCUMENTS

| | | |
|---|---|---|
| CN | 105739200 | 7/2016 |
| CN | 107463041 | 12/2017 |
| CN | 109377874 | 2/2019 |
| CN | 208999734 | 6/2019 |
| CN | 110109301 | 8/2019 |
| CN | 209417489 | 9/2019 |
| CN | 110850649 | 2/2020 |
| KR | 2010-0057437 | 5/2010 |
| KR | 20170039059 A * | 4/2017 |

* cited by examiner

DISPLAY PANEL AND ELECTRONIC DEVICE HAVING SAME

RELATED APPLICATIONS

This application is a National Phase of PCT Patent Application No. PCT/CN2020/086031 having International filing date of Apr. 22, 2020, which claims the benefit of priority of Chinese Patent Application No. 202010204810.4 filed on Mar. 22, 2020. The contents of the above applications are all incorporated by reference as if fully set forth herein in their entirety.

FIELD AND BACKGROUND OF THE INVENTION

The present disclosure relates to the field of display panel technology, and in particular, to a display panel and an electronic device.

In current technology, in a bonding area, a display panel comprises a plurality of first connecting lines arranged in a first direction, a plurality of second connecting lines arranged in the second direction, and a plurality of third connecting lines, wherein the first direction is perpendicular to the second direction, the plurality of the first connecting lines, the plurality of the second connecting lines, and the plurality of the third connecting lines are arranged in different layers and are insulated from each other, and the plurality of the second connecting lines are arranged between the plurality of the first connecting lines and the plurality of the third connecting lines. Each of the third connecting lines is electrically connected correspondingly to one of the first connecting lines and one of the second connecting lines through via holes extending through insulation layers. Wherein in a top view, a connecting portion of the third connecting line connected to the corresponding second connecting line overlaps with a neighboring first connecting line, which can easily cause short circuiting.

SUMMARY OF THE INVENTION

Embodiments of the present disclosure provide a display panel and an electronic device to reduce a risk of short circuits between the plurality of the third connecting lines and the plurality of the first connecting lines in the existing display panel.

An embodiment of the present disclosure provides a display panel, wherein the display panel comprises a chip-on-film comprising a plurality of first connecting lines arranged in a first direction and spaced apart from each other, wherein the plurality of the first connecting lines extend in a second direction, and the first direction is perpendicular to the second direction; and a panel body comprising a plurality of second connecting lines arranged in the second direction and spaced apart from each other, wherein the plurality of the second connecting lines extend in the first direction; a first insulation layer arranged between the plurality of the first connecting lines and the plurality of the second connecting lines; a second insulation layer arranged at a side of the plurality of the second connecting lines away from the plurality of the first connecting lines, wherein the second insulation layer defines first holes extending through the first insulation layer and the second insulation layer, and second holes extending through the second insulation layer; and a plurality of third connecting lines arranged at a side of the second insulation layer away from the plurality of the second connecting lines and spaced apart from each other, wherein each of the plurality of the third connecting lines is electrically connected to a corresponding one of the plurality of the first connecting lines via a corresponding one of the first holes, and each of the plurality of the third connecting lines is electrically connected to a corresponding one of the plurality of the second connecting lines via a corresponding one of the second holes; wherein each of the second holes does not overlap with the plurality of the first connecting lines in a top view.

According to an embodiment of the present disclosure, in the top view, each of the plurality of the first connecting lines is arranged at a side of a corresponding one of the plurality of the second connecting lines, the first connecting line comprises an end next to the corresponding second connecting line and a first body extending from the end to a direction away from the corresponding second connecting line, and the corresponding second hole is arranged at a side of the end away from the first body.

According to an embodiment of the present disclosure, each of the plurality of the third connecting lines comprises a second body and an additional portion connected to a side of the second body, wherein the second body is connected to the corresponding first connecting line and the corresponding second connecting line, the second body comprises a connecting portion aligned with the corresponding first hole and the corresponding second hole, the additional portion is connected to the corresponding first connecting line and the corresponding second connecting line, and the additional portion is arranged at a side of the corresponding first hole and the corresponding second hole.

According to an embodiment of the present disclosure, in the top view, the second body is rectangular, and the additional portion is trapezoid, wherein a long edge of the additional portion is connected to a side of the second body, and a short edge of the additional portion is opposite to the long edge.

An embodiment of the present disclosure provides a display panel, wherein the display panel comprises a plurality of first connecting lines arranged in a first direction and spaced apart from each other, wherein the plurality of the first connecting lines extend in a second direction, and the first direction is perpendicular to the second direction; a plurality of second connecting lines arranged in the second direction and spaced apart from each other, wherein the plurality of the second connecting lines extend in the first direction; a first insulation layer arranged between the plurality of the first connecting lines and the plurality of the second connecting lines; a second insulation layer arranged at a side of the plurality of the second connecting lines away from the plurality of the first connecting lines, wherein the second insulation layer defines first holes extending through the first insulation layer and the second insulation layer, and second holes extending through the second insulation layer; and a plurality of third connecting lines arranged at a side of the second insulation layer away from the plurality of the second connecting lines and spaced apart from each other, wherein each of the plurality of the third connecting lines is electrically connected to a corresponding one of the plurality of the first connecting lines via a corresponding one of the first holes, and each of the plurality of the third connecting lines is electrically connected to a corresponding one of the plurality of the second connecting lines via a corresponding one of the second holes; wherein each of the second holes does not overlap with the plurality of the first connecting lines in a top view.

According to an embodiment of the present disclosure, in the top view, each of the plurality of the first connecting lines is arranged at a side of a corresponding one of the plurality of the second connecting lines, wherein the first connecting line comprises an end next to the corresponding second connecting line and a first body extending from the end to a direction away from the corresponding second connecting line, and the corresponding second hole is arranged at a side of the end away from the first body.

According to an embodiment of the present disclosure, in the top view, a direction from the corresponding second hole towards the first connecting line is the second direction.

According to an embodiment of the present disclosure, a side of the corresponding second connecting line defines a notch, and the end of the first connecting line is arranged in the notch in the top view.

According to an embodiment of the present disclosure, each of the plurality of the third connecting lines comprises a second body and an additional portion connected to a side of the second body, wherein the second body is connected to the corresponding first connecting line and the corresponding second connecting line, the second body comprises a connecting portion aligned with the corresponding first hole and the corresponding second hole, the additional portion is connected to the corresponding first connecting line and the corresponding second connecting line, and the additional portion is arranged at a side of the corresponding first hole and the corresponding second hole.

According to an embodiment of the present disclosure, in the top view, the second body is rectangular, and the additional portion is trapezoid, wherein a long edge of the additional portion is connected to a side of the second body, and a short edge of the additional portion is opposite to the long edge.

According to an embodiment of the present disclosure, a width of each of the plurality of the third connecting lines is greater than 25 µm in the first direction.

According to an embodiment of the present disclosure, a material of each of the plurality of the first connecting lines comprises copper, a material of each of the plurality of the second connecting lines comprises copper, and a material of each of the plurality of the third connecting lines comprises indium tin oxide.

An embodiment of the present disclosure provides an electronic device comprising a display panel, wherein the display panel comprises a plurality of first connecting lines arranged in a first direction and spaced apart from each other, wherein the plurality of the first connecting lines extend in a second direction, and the first direction is perpendicular to the second direction; a plurality of second connecting lines arranged in the second direction and spaced apart from each other, wherein the plurality of the second connecting lines extend in the first direction; a first insulation layer arranged between the plurality of the first connecting lines and the plurality of the second connecting lines; a second insulation layer arranged at a side of the plurality of the second connecting lines away from the plurality of the first connecting lines, wherein the second insulation layer defines first holes extending through the first insulation layer and the second insulation layer, and second holes extending through the second insulation layer; and a plurality of third connecting lines arranged at a side of the second insulation layer away from the plurality of the second connecting lines and spaced apart from each other, wherein each of the plurality of the third connecting lines is electrically connected to a corresponding one of the plurality of the first connecting lines via a corresponding one of the first holes, and each of the plurality of the third connecting lines is electrically connected to a corresponding one of the plurality of the second connecting lines via a corresponding one of the second holes; wherein each of the second holes does not overlap with the plurality of the first connecting lines in a top view.

According to an embodiment of the present disclosure, in the top view, each of the plurality of the first connecting lines is arranged at a side of a corresponding one of the plurality of the second connecting lines, wherein the first connecting line comprises an end next to the corresponding second connecting line and a first body extending from the end to a direction away from the corresponding second connecting line, and the corresponding second hole is arranged at a side of the end away from the first body.

According to an embodiment of the present disclosure, in the top view, a direction from the corresponding second hole towards the first connecting line is the second direction.

According to an embodiment of the present disclosure, a side of the corresponding second connecting line defines a notch, and the end of the first connecting line is arranged in the notch in the top view.

According to an embodiment of the present disclosure, each of the plurality of the third connecting lines comprises a second body and an additional portion connected to a side of the second body, wherein the second body is connected to the corresponding first connecting line and the corresponding second connecting line, the second body comprises a connecting portion aligned with the corresponding first hole and the corresponding second hole, the additional portion is connected to the corresponding first connecting line and the corresponding second connecting line, and the additional portion is arranged at a side of the corresponding first hole and the corresponding second hole.

According to an embodiment of the present disclosure, in the top view, the second body is rectangular, and the additional portion is trapezoid, wherein a long edge of the additional portion is connected to a side of the second body, and a short edge of the additional portion is opposite to the long edge.

According to an embodiment of the present disclosure, a width of each of the plurality of the third connecting lines is greater than 25 µm in the first direction.

According to an embodiment of the present disclosure, a material of each of the plurality of the first connecting lines comprises copper, a material of each of the plurality of the second connecting lines comprises copper, and a material of each of the plurality of the third connecting lines comprises indium tin oxide.

In the display panel and the electronic device provided in the embodiments of the present disclosure, each of the second holes does not overlap with the plurality of the first connecting lines in a top view, reducing a risk of short circuits between the plurality of the third connecting lines in the second holes and the plurality of the first connecting lines when the second holes overlap with the plurality of the first connecting lines.

DESCRIPTION OF SPECIFIC EMBODIMENTS OF THE INVENTION

To make the objectives, technical solutions, and effects of the present disclosure clearer and more specific, the present disclosure is described in further detail below with reference to the embodiments accompanying with drawings. It should be understood that the specific embodiments described herein are merely for explaining the present disclosure, not for limiting the present disclosure.

Figure 1:
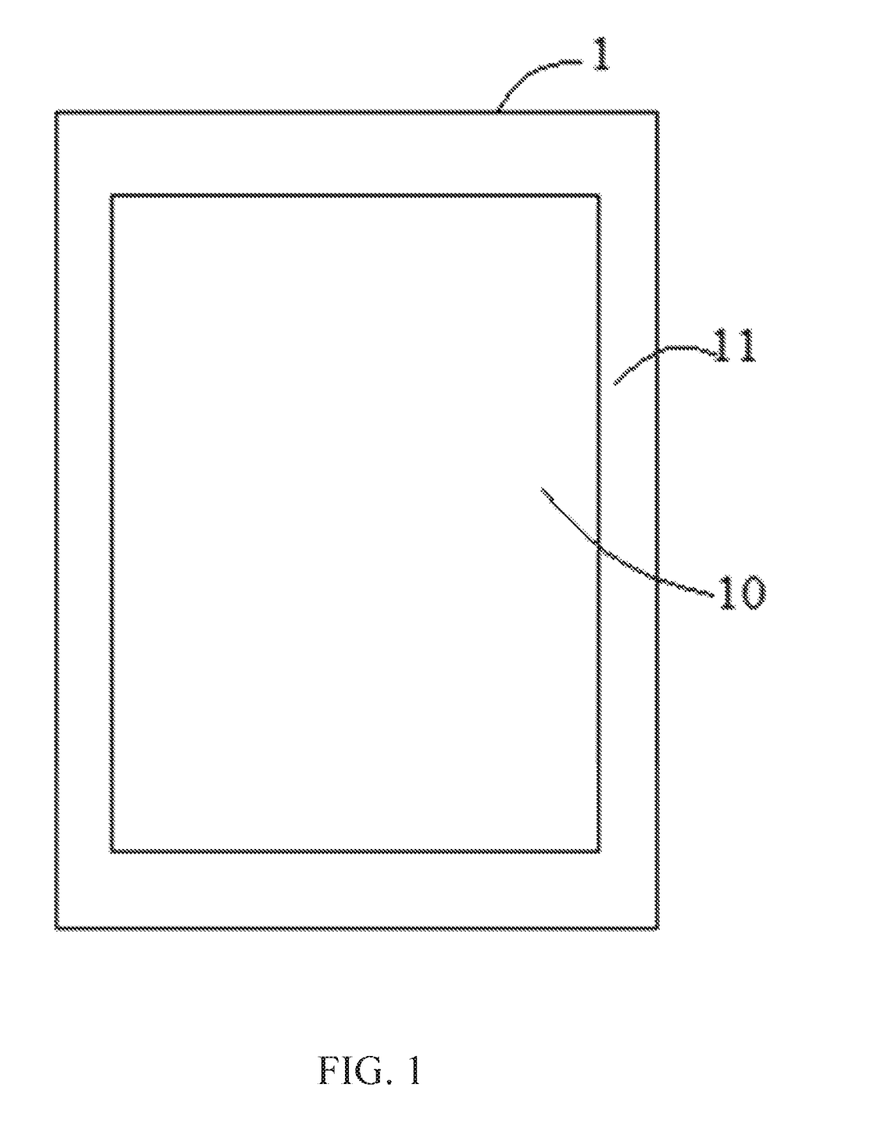
FIG. 1 is a schematic structural diagram illustrating a display panel in a top view according to an embodiment of the present disclosure.
Figure 2:
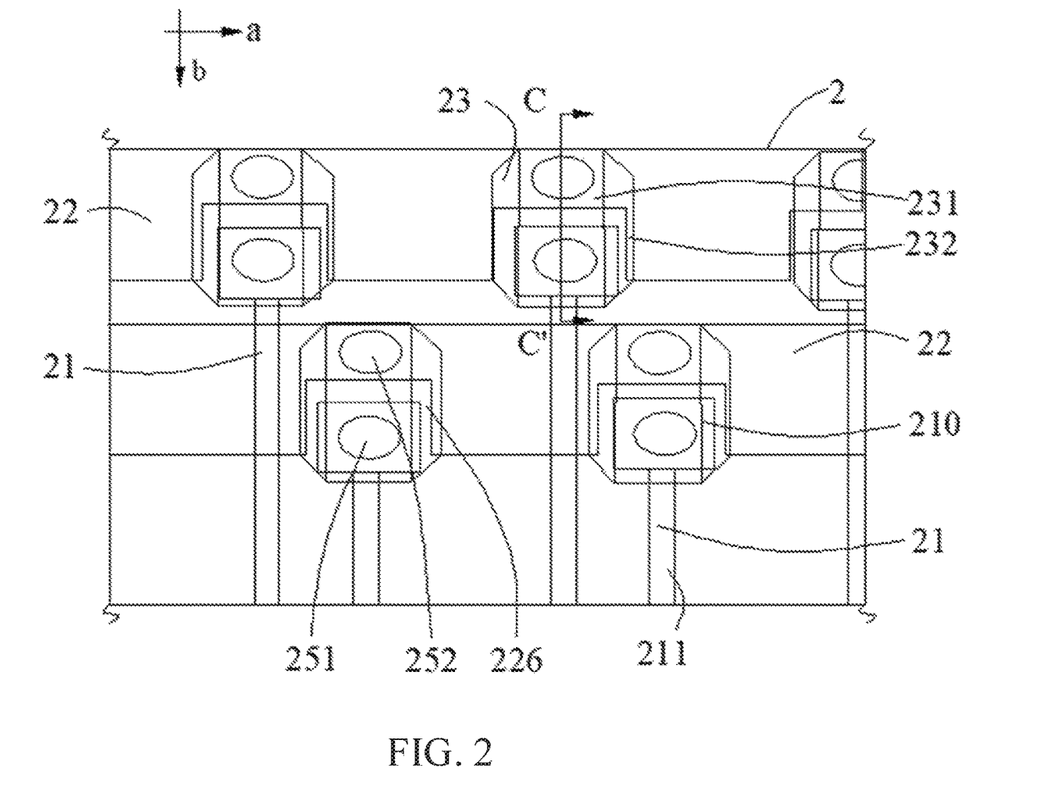
FIG. 2 is a schematic structural diagram illustrating a display panel in a top view according to an embodiment of the present disclosure, wherein the display panel comprises a panel body and a chip-on-film.

As shown in FIG. 1 and FIG. 2, an embodiment of the present disclosure provides a display panel 1. The display panel 1 comprises a display area 10 and a non-display area 11 surrounding the display area 10. The display panel 1 comprises a panel body 2 and a chip-on-film (COF). A category of the display panel 1 is not limited to a liquid crystal display panel, an organic light emitting display panel, or a quantum dot display panel.

As shown in FIG. 2, the COF is arranged in the non-display area 11. The COF comprises a plurality of first connecting lines 21 arranged in a first direction a (from left to right) and are spaced apart from each other, wherein the plurality of the first connecting lines 21 extend in a second direction b, and the first direction a is perpendicular to the second direction b (from top to down). Optionally, a material of each of the plurality of the first connecting lines 21 comprises a metal material, such as copper.

Figure 3:
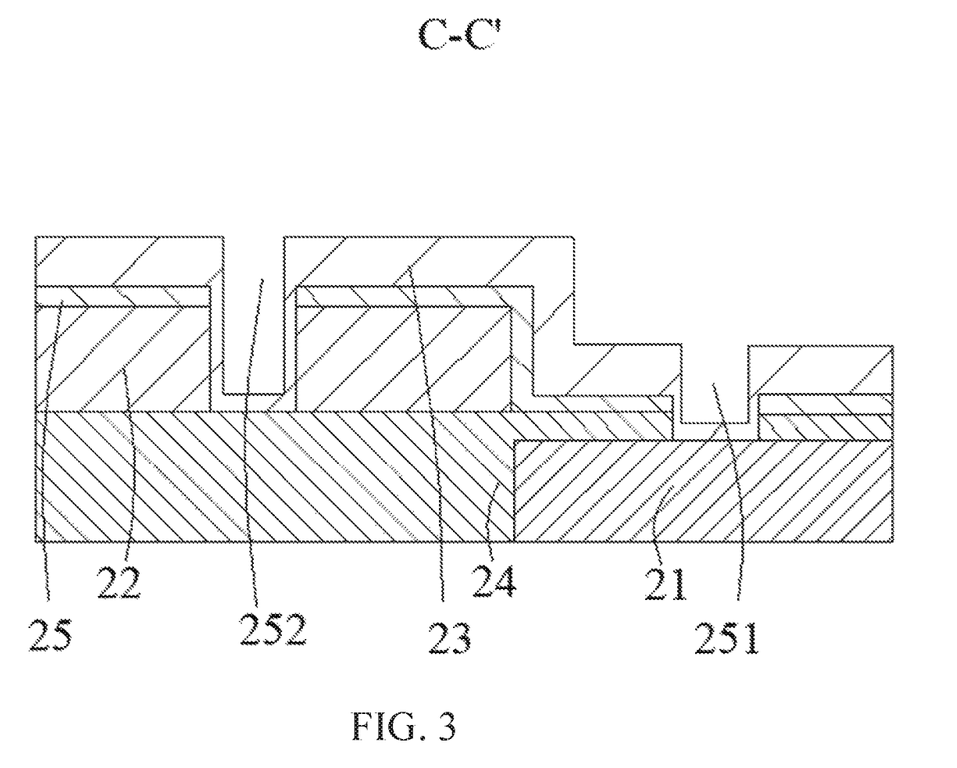
FIG. 3 is a schematic sectional diagram of the panel body and the chip-on-film taken along line C-C' in FIG. 2.

As shown in FIG. 2 and FIG. 3, the panel body 2 comprises functional elements arranged in the display area 10 and the non-display area 11. The panel body 2 comprises a plurality of second connecting lines 22 arranged in the second direction b and spaced apart from each other, a first insulation layer 24 arranged between the plurality of the first connecting lines 21 and the plurality of the second connecting lines 22, a second insulation layer 25 arranged at a side of the plurality of the second connecting lines 22 away from the plurality of the first connecting lines 21, and a plurality of third connecting lines 23 arranged at a side of the second insulation layer 24 away from the plurality of the second connecting lines 22 and spaced apart from each other. Optionally, a material of each of the plurality of the second connecting lines 22 comprises a metal material such as copper, a material of each of the plurality of the third connecting lines 23 comprises indium tin oxide (ITO), the first insulation layer 24 comprises an inorganic material such as silicon oxide or silicon nitride, the second insulation layer 25 comprises an inorganic material such as silicon oxide or silicon nitride.

The plurality of the second connecting lines 22 extend in the first direction a.

The plurality of the third connecting lines 23 are configured to transmit signals between the plurality of the first connecting lines 21 and the plurality of the second connecting lines 22, such as data signals.

On the second insulation layer 25 are defined first holes 251 that extend through the first insulation layer 24 and the second insulation layer 25, and second holes 252 that extend through the second insulation layer 25. Optionally, the both the first holes 251 and the second holes 252 can be elliptical or polygonal.

Each of the third connecting lines 23 is electrically connected to a corresponding first connecting line 21 via a corresponding first hole 251, and each of the third connecting lines 21 is electrically connected to a corresponding second connecting line 22 via a corresponding second hole 251. Optionally, each of the third connecting lines 21 corresponds to several first holes 251.

Wherein each of the second holes 252 does not overlap with the plurality of the first connecting lines 21 in a top view.

In the display panel 1 provided in the embodiment of the present disclosure, each second hole 252 does not overlap with the plurality of the first connecting lines 21 in the top view, reducing short circuit risk between the plurality of the third connecting lines 23 in the second holes 252 and the plurality of the first connecting lines 21 when the second holes 252 overlap with the plurality of the first connecting lines 21.

In an embodiment, as shown in FIG. 2, in the top view, each of the plurality of the first connecting lines 21 is arranged at a side of a corresponding one of the plurality of the second connecting lines 22, each of the plurality of the first connecting lines 21 comprises an end 210 next to the corresponding second connecting line 22 and a first body 211 extending from the end 210 to a direction away from the corresponding second connecting line 22, and the corresponding second hole 252 is arranged at a side of the end 210 away from the first body.

In an embodiment, as shown in FIG. 2, a direction from the corresponding second hole 252 towards the first connecting line 21 is the second direction b. That is, an extension of the first connecting line 21 extends through the corresponding second hole 252.

In an embodiment, as shown in FIG. 2, a side of the corresponding second connecting line 22 defines a notch 226, and the end 210 of the first connecting line 21 is arranged in the notch 226 in the top view.

In an embodiment, as shown in FIG. 2, each of the plurality of the third connecting lines 23 comprises a second body 231 and an additional portion 232 connected to a side of the second body 231, wherein the second body 231 is connected to the corresponding first connecting line 21 and the corresponding second connecting line 22, and the second body 231 comprises a connecting portion aligned with the corresponding first hole 251 and the corresponding second hole 252, wherein the additional portion 232 is connected to the corresponding first connecting line 21 and the corresponding second connecting line 22, and the additional portion 232 is arranged at a side of the corresponding first hole 251 and the corresponding second hole 252. This arrangement can ensure that when the connecting portion of the second body 231 is damaged, the additional portion 232 can still conduct electricity, so as to ensure the function does not fail.

In an embodiment, each of the plurality of the third connecting lines 23 corresponds to several second holes 252. The second holes 252 are located on the second body 231 and the additional portion 232 of the third connecting line 23.

In an embodiment, as shown in FIG. 2, in the top view, each of the plurality of the third connecting lines 23 is octagonal, wherein the second body 231 is rectangular, and there are two additional portions 232 that are trapezoid. A long edge of the additional portion 232 is connected to a side of the second body 231, and a short edge of the additional portion 232 is opposite to the long edge.

In an embodiment, a width of each of the plurality of the third connecting lines 23 is greater than 25 µm in the first direction a, such as 45 µm. This arrangement can reduce resistance of the third connection line 23 at a cross-section and a probability of electrical damage.

In an embodiment, the plurality of the third connecting lines 23 can be a part of another element, and is not limited to be a part of the chip-on-film.

In an embodiment, the display panel 1 further comprises an anti-short-circuit layer arranged between the plurality of the first connecting lines 21 and the plurality of the second connecting lines 22. Optionally, the anti-short-circuit layer is an AS layer (which is a general term of an ohmic contact layer and a semiconductor layer in a panel design). Optionally, the anti-short-circuit layer is arranged at a side of the first insulation layer 24 next to each of the plurality of the first connecting lines 21, or at a side of the first insulation layer 24 away from each of the plurality of the first connecting lines 21. Optionally, a thickness of a portion of the anti-short-circuit layer at a part of each of the plurality of the first connecting lines 21 next to a corresponding one of the plurality of the second connecting lines 22 is greater than a thickness of a portion of the anti-short-circuit layer at a part of each of the plurality of the first connecting lines 21 away from the corresponding one of the plurality of the second connecting lines 22.

An embodiment of the present disclosure further provides an electronic device comprising the above display panel 1, wherein the electronic device can be products or components with display functions, such as display modules, fixing terminals such as desktop computers and televisions, mobile terminals such as smartphones and personal digital assistants, or wearable devices such as smart watches and head-mounted devices.

It can be understood that, for those skilled in the art, equivalent replacements and modifications can be made according to the technical solution and disclosure ideas thereof of the present disclosure, and all these modifications or replacements are considered within the protection scope of the attached claims of the present disclosure.

What is claimed is:

1. A display panel comprising:
   a chip-on-film comprising a plurality of first connecting lines arranged in a first direction and spaced apart from each other, wherein the plurality of the first connecting lines extend in a second direction, and the first direction is perpendicular to the second direction; and
   a panel body comprising:
      a plurality of second connecting lines arranged in the second direction and spaced apart from each other, wherein the plurality of the second connecting lines extend in the first direction;
      a first insulation layer arranged between the plurality of the first connecting lines and the plurality of the second connecting lines;
      a second insulation layer arranged at a side of the plurality of the second connecting lines away from the plurality of the first connecting lines, wherein the second insulation layer is defined with first holes extending through the first and the second insulation layers, and is defined with second holes extending through the second insulation layer; and
      a plurality of third connecting lines arranged at a side of the second insulation layer away from the plurality of the second connecting lines and spaced apart from each other, wherein each of the plurality of the third connecting lines is electrically connected to a corresponding one of the plurality of the first connecting lines via a corresponding one of the first holes, and each of the plurality of the third connecting lines is electrically connected to a corresponding one of the plurality of the second connecting lines via a corresponding one of the second holes;
      wherein each of the second holes does not overlap with the plurality of the first connecting lines in a top view.

2. The display panel as claimed in claim 1, wherein in the top view, each of the plurality of the first connecting lines is arranged at a side of a corresponding one of the plurality of the second connecting lines, the first connecting line comprises an end next to the corresponding second connecting line and a first body extending from the end to a direction away from the corresponding second connecting line, and the corresponding second hole is arranged at a side of the end away from the first body.

3. The display panel as claimed in claim 2, wherein each of the plurality of the third connecting lines comprises a second body and an additional portion connected to a side of the second body, the second body is connected to the corresponding first connecting line and the corresponding second connecting line, the second body comprises a connecting portion aligned with the corresponding first hole and the corresponding second hole, the additional portion is connected to the corresponding first connecting line and the corresponding second connecting line, and the additional portion is arranged at a side of the corresponding first hole and the corresponding second hole.

4. The display panel as claimed in claim 3, wherein in the top view, the second body is rectangular, the additional portion is trapezoid, a long edge of the additional portion is connected to the side of the second body, and a short edge of the additional portion is opposite to the long edge of the additional portion.

5. The display panel as claimed in claim 2, wherein in the top view, a direction from the corresponding second hole towards the first connecting line is the second direction.

6. The display panel as claimed in claim 2, wherein a side of the corresponding second connecting line defines a notch, and the end of the first connecting line is arranged in the notch in the top view.

7. The display panel as claimed in claim 2, wherein a width of each of the plurality of the third connecting lines is greater than 25 μm in the first direction.

8. The display panel as claimed in claim 1, wherein a material of each of the plurality of the first connecting lines comprises copper, a material of each of the plurality of the second connecting lines comprises copper, and a material of each of the plurality of the third connecting lines comprises indium tin oxide.

9. A display panel comprising:
   a plurality of first connecting lines arranged in a first direction and spaced apart from each other, wherein the plurality of the first connecting lines extend in a second direction, and the first direction is perpendicular to the second direction;
   a plurality of second connecting lines arranged in the second direction and spaced apart from each other, wherein the plurality of the second connecting lines extend in the first direction;
   a first insulation layer arranged between the plurality of the first connecting lines and the plurality of the second connecting lines;
   a second insulation layer arranged at a side of the plurality of the second connecting lines away from the plurality of the first connecting lines, wherein the second insulation layer is defined with first holes extending through the first insulation layer and the second insulation layer, and is defined with second holes extending through the second insulation layer; and a plurality of third connecting lines arranged at a side of the second insulation layer away from the plurality of the second connecting lines and spaced apart from each other, wherein each of the plurality of the third connecting lines is electrically connected to a corresponding one of the plurality of the first connecting lines via a corresponding one of the first holes, and each of the plurality of the third connecting lines is electrically connected to a corresponding one of the plurality of the second connecting lines via a corresponding one of the second holes;

wherein in a top view, each of the second holes does not overlap with the plurality of the first connecting lines, and each of the plurality of the first connecting lines is arranged at a side of a corresponding one of the plurality of the second connecting lines;

each of the plurality of the first connecting lines comprises an end next to the corresponding one of the second connecting lines and a first body extending from the end to a direction away from the corresponding one of the second connecting lines, a corresponding one of the second holes is arranged at a side of the end away from the first body, and in the top view, a side of the corresponding one of the second connecting lines defines a notch where the end is arranged therein.

10. The display panel as claimed in claim 9, wherein in the top view, a direction from the corresponding second hole towards the first connecting line is the second direction.

11. The display panel as claimed in claim 9, wherein each of the plurality of the third connecting lines comprises a second body and an additional portion connected to a side of the second body, the second body is connected to the corresponding first connecting line and the corresponding second connecting line, the second body comprises a connecting portion aligned with the corresponding first hole and the corresponding second hole, the additional portion is connected to the corresponding first connecting line and the corresponding second connecting line, and the additional portion is arranged at a side of the corresponding first hole and the corresponding second hole.

12. The display panel as claimed in claim 11, wherein in the top view, the second body is rectangular, the additional portion is trapezoid, a long edge of the additional portion is connected to the side of the second body, and a short edge of the additional portion is opposite to the long edge.

13. The display panel as claimed in claim 9, wherein a width of each of the plurality of the third connecting lines is greater than 25 μm in the first direction.

14. The display panel as claimed in claim 9, wherein a material of each of the plurality of the first connecting lines comprises copper, a material of each of the plurality of the second connecting lines comprises copper, and a material of each of the plurality of the third connecting lines comprises indium tin oxide.

15. An electronic device comprising a display panel, wherein the display panel comprises:
a plurality of first connecting lines arranged in a first direction and spaced apart from each other, wherein the plurality of the first connecting lines extend in a second direction, and the first direction is perpendicular to the second direction;
a plurality of second connecting lines arranged in the second direction and spaced apart from each other, wherein the plurality of the second connecting lines extend in the first direction;

a first insulation layer arranged between the plurality of the first connecting lines and the plurality of the second connecting lines;

a second insulation layer arranged at a side of the plurality of the second connecting lines away from the plurality of the first connecting lines, wherein the second insulation layer is defined with first holes extending through the first and the second insulation layers, and is defined with second holes extending through the second insulation layer; and a plurality of third connecting lines arranged at a side of the second insulation layer away from the plurality of the second connecting lines and spaced apart from each other, wherein each of the plurality of the third connecting lines is electrically connected to a corresponding one of the plurality of the first connecting lines via a corresponding one of the first holes, and each of the plurality of the third connecting lines is electrically connected to a corresponding one of the plurality of the second connecting lines via a corresponding one of the second holes;

wherein each of the second holes does not overlap with the plurality of the first connecting lines;

each of the plurality of the third connecting lines comprises a second body and an additional portion connected to a side of the second body, the second body is connected to the corresponding one of the first connecting lines and the corresponding one of the second connecting lines, the second body comprises a connecting portion aligned with the corresponding one of the first holes and the corresponding one of the second holes, the additional portion is connected to the corresponding one of the first connecting lines and the corresponding one of the second connecting lines, and the additional portion is arranged at a side of the corresponding one of the first hole and the corresponding one of the second holes; and in the top view, the second body is rectangular, the additional portion is trapezoid, a long edge of the additional portion is connected to the side of the second body, and a short edge of the additional portion is opposite to the long edge.

16. The electronic device as claimed in claim 15, wherein in the top view, each of the plurality of the first connecting lines is arranged at a side of a corresponding one of the plurality of the second connecting lines, the first connecting line comprises an end next to the corresponding second connecting line and a first body extending from the end to a direction away from the corresponding second connecting line, and the corresponding second hole is arranged at a side of the end away from the first body.

17. The electronic device as claimed in claim 16, wherein in the top view, a direction from the corresponding second hole towards the first connecting line is the second direction.

18. The electronic device as claimed in claim 16, wherein a side of the corresponding second connecting line defines a notch, and the end of the first connecting line is arranged in the notch in the top view.

19. The electronic device as claimed in claim 16, wherein a width of each of the plurality of the third connecting lines is greater than 25 μm in the first direction.

20. The electronic device as claimed in claim 15, wherein a material of each of the plurality of the first connecting lines comprises copper, a material of each of the plurality of the second connecting lines comprises copper, and a material of each of the plurality of the third connecting lines comprises indium tin oxide.

\* \* \* \* \*